United States Patent

Fujita et al.

Patent Number: 5,329,244
Date of Patent: Jul. 12, 1994

[54] LINEAR COMPENSATING CIRCUIT

[75] Inventors: Noriyuki Fujita; Masahiko Tanaka, both of Tokyo, Japan

[73] Assignee: NEC Corporation, Japan

[21] Appl. No.: 923,323

[22] Filed: Jul. 31, 1992

[30] Foreign Application Priority Data

Jul. 31, 1991 [JP]  Japan .................................. 3-214371

[51] Int. Cl.$^5$ ............................................. H03F 1/26
[52] U.S. Cl. ..................................... 330/149; 330/136
[58] Field of Search ............. 330/107, 129, 136, 149; 328/155; 332/159, 160, 161, 162

[56] References Cited

U.S. PATENT DOCUMENTS

| 5,101,172 | 3/1992 | Ikeda et al. | 330/136 |
| 5,121,077 | 6/1992 | McGann | 330/149 |
| 5,124,665 | 6/1992 | McGann | 330/149 |

Primary Examiner—Steven Mottola
Attorney, Agent, or Firm—Ostrolenk, Faber, Gerb & Soffen

[57] ABSTRACT

A linear compensating circuit comprises a first level detection circuit for detecting the level of an input signal to an amplifier, a second level detection circuit for detecting the level of an output signal from the amplifier, an amplitude compensating circuit for controlling the amplitude of the input signal in accordance with the difference between the signal level detected by the first detection circuit and the signal level detected by the second level detection circuit for improving the linearity of an input-output characteristic of the amplifier, and a phase compensating circuit for controlling the phase of the input signal in accordance with the signal level detected by the second detection circuit. The linear compensating circuit compensates for both amplitude and phase and, as a result, the degradation of phase characteristic caused by amplitude compensation can be prevented, resulting in a reduction in the distortion of the output signal of the amplifier even when it is being operated in the vicinity of the saturation range. This linear compensating circuit is effective when applied to a power amplifier, particularly to a high frequency power amplifier.

16 Claims, 1 Drawing Sheet

LINEAR COMPENSATING CIRCUIT

BACKGROUND OF THE INVENTION

1. Field of the Invention

This invention relates to a linear compensating circuit and more particularly, to a linear compensating circuit for compensating the linearity of an input-output characteristic of an amplifier.

2. Description of the Related Art

Generally, in a linear compensating circuit of a high frequency power amplifier, the output power of the amplifier is made equal in level to the input power thereof and compared therewith and then, controlled so that the difference i.e., variation, between the input and output powers of the amplifier can be made zero thereby keeping its input-output characteristic linear. An exemplary application of such a linear compensating circuit is described.

In the front stage of a high frequency power amplifier, an amplitude compensating circuit for compensating an amplitude of an input signal to be inputted to the amplifier is provided. In addition, there are provided a first detection circuit for detecting a level of the power of the input signal, a second detection circuit for detecting a level of the power of an output signal of the amplifier and a differential amplifier for detecting the difference in power between the input and output signals of the amplifier and for outputting a signal in accordance with the detected difference. The level of the output signal is made equal to that of the input signal (that is, the level before amplification) and then, sent to a second detection circuit. The amplitude compensating circuit controls the amplitude of the input signal in advance in accordance with the signal from the differential amplifier so that the difference in power between the input and output signals is made substantially zero.

As explained above, with the conventional linear compensating circuit, an input signal to be inputted to the amplifier is subjected to amplitude compensation and then, sent thereto, thus keeping the input-output power characteristic of the amplifier linear over the entire circuit including the linear compensating circuit and the amplifier.

According to the conventional linear compensating circuit as described above, the linearity of an input-output power characteristic of a high frequency power amplifier can be improved so that distortion of an output signal is prevented from being induced when the amplifier is to be operated in the non-linear range when the level of the input signal is high. With this linear compensating circuit, however, when the amplifier is being operated in the saturation range because the input signal level is further increased, an acceptable input-output characteristic cannot be obtained. Thus the a problem that a desired reduction in signal distortion be attained remains.

Thus, an object of this invention is to provide a linear compensating circuit capable of amplifying a signal with the extremely low level of signal distortion even when an amplifier is being operated in the saturation range.

Another object of this invention is to provide an amplifier capable of amplifying a signal while producing an extremely low level of signal distortion over a wide range of input signal levels.

SUMMARY OF THE INVENTION

In a first aspect of this invention, a linear compensating circuit is provided, which comprises first level detection means for detecting a level of an input signal to be inputted to amplifying means, second level detection means for detecting a level of an output signal to be outputted from the amplifying means, amplitude compensating means for controlling the amplitude of the input signal in accordance with a difference between a signal level detected by the first level detection means and a signal level detected by the second level detection means thereby improving the linearity of an input-output characteristic of the amplifying means, and phase compensating means for controlling the phase of the input signal in accordance with a level of an output signal detected by the second level detection means.

In general, when an input signal to an amplifier is subjected to amplitude compensation by an amplitude compensating circuit, an output signal of the amplifier has a degraded phase characteristic compared with the case when the amplifier is not subjected to amplitude compensation. Particularly, when it is applied to a power amplifier, if the input power is increased to near the saturation range, its phase is changed substantially changed, resulting in high degradation. As a result, the output signal becomes highly distorted due to the degradation of phase characteristic in the vicinity of the saturation range.

With the linear compensating circuit according to this invention, the input signal to interrelated an amplifier is subjected to amplitude and phase compensations, so that the degradation of the phase characteristic due to amplitude compensation can be prevented. Accordingly, even when it is being operated in the vicinity of the saturation range, the distortion of an output signal from the amplifier can be satisfactorily reduced. The linear compensating circuit of this invention is effective when applied to a power amplifier, particularly to a high frequency power amplifier.

As the first and second level detection means, for example, any detector that is known can be employed. The input or output signal of each of the first and second level detection means is preferable to be supplied through a branching circuit. In addition, it is preferable that the output signal has the level controlled to the same level as the input signal before being inputted to the second level detection means.

As the amplitude compensating means, any circuit can be employed, if it can control the amplitude of the input signal in accordance with the level difference detected by the first and second level detection means.

As the phase compensating means, any circuit can be employed if it can control the phase of the input signal in accordance with the level of the output signal. In addition, it is preferable that the phase compensating means has a phase characteristic set so as to cancel the phase change of the output signal induced due to the amplitude compensation by the amplitude compensating means. For example, when it is applied to a power amplifier, if the input power becomes large, the phase of the output power is advanced in general. The phase compensating means has a phase characteristic set so as to delay the phase of the input power signal, thus resulting in almost no change in phase after amplification.

In a second aspect of this invention, an amplifier is provided which is extremely small in output distortion over a wide range of input signal. This amplifier has the linear compensation circuit according to the first aspect of this invention.

DESCRIPTION OF THE PREFERRED EMBODIMENT

Figure 1:
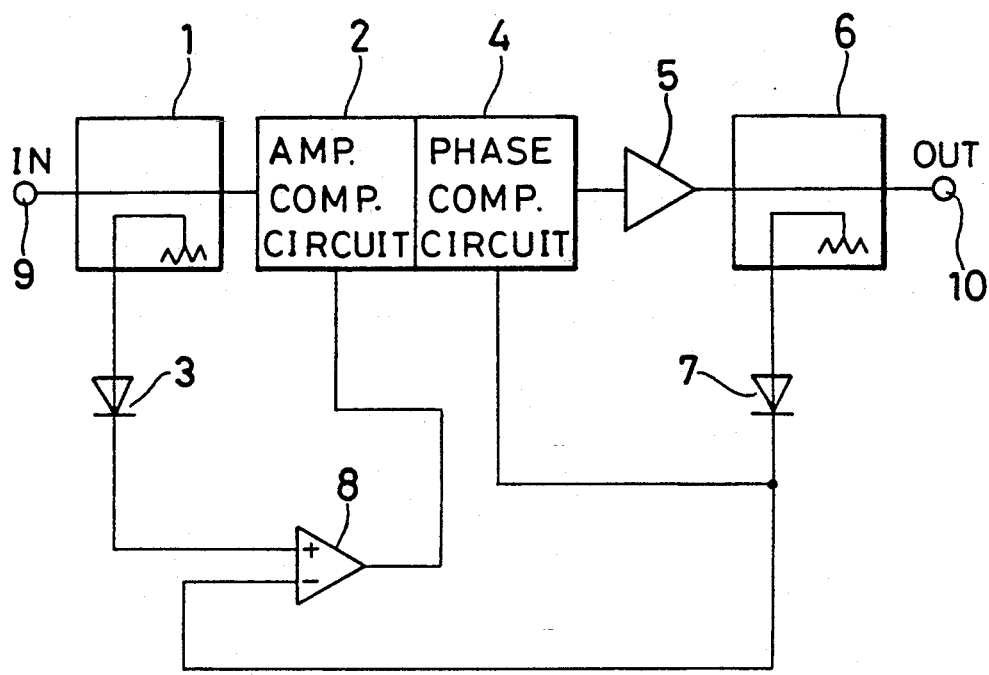
FIG. 1 is a block diagram of a circuit including a high frequency power amplifier with a linear compensating circuit according to an embodiment of this invention.

An embodiment of this invention will be described below while referring to the drawings.

FIG. 1 shows a high frequency power amplifier in which a linear compensating circuit of an embodiment of this invention is applied.

In FIG. 1, a high frequency power amplifier 5 has in the front stage thereof a first branching circuit 1 for supplying an input signal to the amplifier 5, an amplitude compensating circuit 2 for compensating an amplitude of the input signal, and a phase compensating circuit 4 for compensating a phase of the input signal connected in series with the amplifier compensating circuit 2. An input signal supplied from an input terminal 9 passes through the first branching circuit 1, amplitude compensating circuit 2 and phase compensating circuit 4 and applied to the amplifier 5. The input signal is also supplied by the first branching circuit 1 to a first detector 3 which comprises a diode for detecting the level thereof. The level thus detected is applied to one input terminal of a differential amplifier 8. The first branching circuit 1 is designed to control the level of the signal that it supplies to the detector 3.

The amplifier 5 has a second branching circuit 6 for supplying a sample of the output signal in the back stage thereof. The output signal thus amplified by the amplifier 5 is accessible at an output terminal 10. The output signal sample taken by the second branching circuit 6 is sent to a second detector 7 which comprises a diode as shown to detect the level of the output signal. The level signal thus detected is delivered to the other input terminal of the differential amplifier 8 and simultaneously to the phase compensating circuit 4. The second branching circuit 6 can also control the level of a signal to be sent out.

The output signal provided by the second branching circuit 6 is made equal in level to the input signal (that is, the level before amplification and amplitude compensation) in the second branching circuit 6 itself, and then, sent to the second detector 7. The level control of this output signal may be performed through a suitable circuit which is provided outside the second branching circuit 6.

The differential amplifier 8 amplifies the difference between the signal level detected by the first detector 3 and that detected by the second detector 7 and sends it to the amplitude compensating circuit 2. The amplitude compensating circuit 2 controls, i.e., increases or decreases the amplitude of the input signal in accordance with an output signal from the differential amplifier 8. Thus, the difference between the input signal power from the input terminal 9 and the output signal power from the output terminal 10 is made substantially zero, thus keeping the input-output characteristic of the circuit shown in FIG. 1 linear.

The phase compensating circuit 4 controls the phase of the input signal which is subjected to the amplitude compensation in accordance with the level of the output signal from the second detector 7 so that the phase change of the input signal induced by the amplitude compensation is canceled.

With the circuit structured as above, the input signal supplied from the input terminal 9 is amplitude compensated amplitude through the amplitude compensation circuit 2 and successively phase compensated through the phase compensating circuit 4, so as to cancel the phase change induced by the amplitude compensation, and thereafter, sent to the amplifier 5. As a result, the linearity of an input-output characteristic of the circuit shown in FIG. 1 can be improved and the phase change can be almost perfectly canceled at the same time, thus making it possible to output a signal from the output terminal 10 that has extremely small distortions over a wide range of input signal power.

Figure 2:
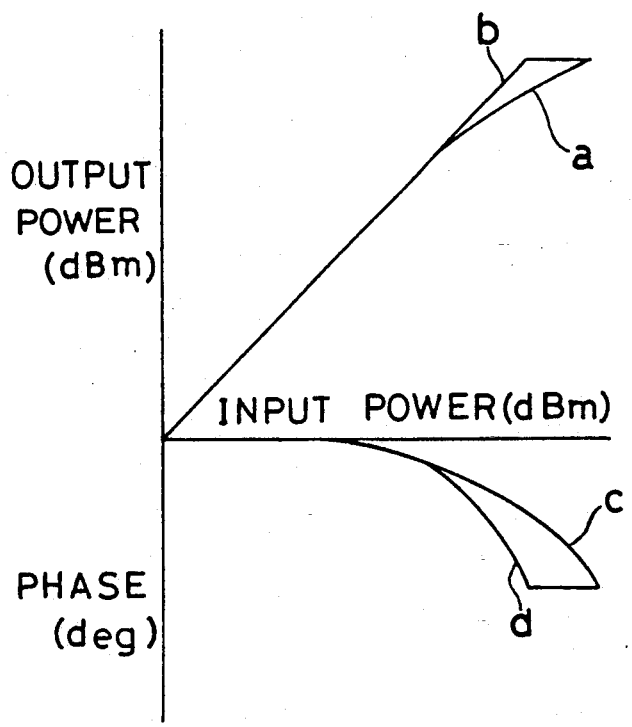
FIG. 2 is a graph showing input-output characteristics of the circuit of FIG. 1.

FIG. 2 shows a change in an output signal (that is, signal power outputted from the output terminal 10) with a change in an input signal (that is, signal power inputted from the input terminal 9) and a change in the phase of an output signal with a change in an input signal of the circuit shown in FIG. 1. In the case the amplitude compensating circuit 2 is not used, as the input power becomes large, the output power changes non-linearly as shown at (a) of FIG. 2. However, in the circuit shown in FIG. 1, the input signal is subjected to the amplitude compensation through the amplitude compensating circuit 2 before being sent to the amplifier 5, so that the output power is changed linearly relative to the input power changes as shown at (b) of FIG. 2.

In addition, in the case where the amplitude compensating circuit 2 is not used, as the input power increases, the phase of the output power changes as shown at (c) of FIG. 2. However, by using only the amplitude compensating circuit 2, the phase change is sharper. In other word, the phase follows the curve shown at (d) of FIG. 2. That is, the use of the amplitude compensating circuit 2 makes it possible to improve the linearity of the input-output characteristic, but adversely increases the phase change. In the circuit shown in FIG. 1, however, the phase characteristic of the phase compensating circuit 4 is set so as to oppose to the characteristic shown at (d) of FIG. 2 in accordance with the signal level detected by the second detector 7, so that the signal level outputted from the second detector 7 becomes large as the output power of the amplifier 5 is increased, and the phase compensating circuit 4 operates so as to cancel the phase change of the output power of the amplifier 5. As a result, the phase characteristic as shown at (c) of FIG. 2 which is to be obtained when the amplitude compensating circuit 2 is not used is obtained, which is desirable.

As explained above, in the linear compensating circuit of this invention, the phase compensating circuit 4 is provided. It serves to operate oppositely to the phase change of the output power of the amplifier 5 in accordance with the output level of the same, and so that, not only the compensation of amplitude but also the compensation of phase of an input signal of the amplifier 5 becomes possible, resulting in an output signal with extremely small distortions.

In the embodiment described above, the amplitude compensating circuit 2 is disposed before the phase compensating circuit 4. But the present invention is not limited thereto. Thus, they may be inversely disposed, that is, the phase compensating circuit 4 may be disposed preceding the amplitude compensating circuit 2 because both circuits 4 and 2 are independent of each other. This means that the amplitude and phase of an input signal may be compensated before being sent to the amplifier 5.

In the above embodiment, no specific circuit for the amplitude compensating circuit 2 and phase compensating circuit 4 is shown. However, any circuit may be used for this purpose with no limitation, if it can operate to compensate amplitude or phase. As the phase compensating circuit 4, for example, a PIN diode can be employed and its bias voltage changed in accordance with the output level of the amplifier 5.

This fact can be applied to the first and second branching circuits 1 and 6 and as a result, any circuit may be employed for this purpose with no limitation, if it can divide out portions or samples of the input or output signals.

As the first and second detection circuits 3 and 7, a diode is employed in the disclosed. But any circuit may be employed for this purpose, if it can detect the level of a signal.

What is claimed is:

1. A linear compensating circuit for maintaining a linearity of an input-output characteristic of an amplifying means comprising:
   first level detection means for detecting a level of an input signal to be inputted to said amplifying means;
   second level detection means for detecting a level of an output signal to be outputted from said amplifying means;
   amplitude compensating means for controlling an amplitude of said input signal in accordance with a difference between a signal level detected by said first detection means and a signal level detected by said second detection means to improve said linearity of said input-output characteristic of said amplifying means; and
   phase compensating means for controlling a phase of said input signal in accordance with a level of an output signal detected by said second level detection means wherein at least one of said input and output signals is provided through a branching circuit, said branching circuit being effective for controlling said level of said input signal and said level of said output signal associated, respectively, with said first level detection means and said second level detection means.

2. A linear compensating circuit for maintaining a linearity of an input-output characteristic of an amplifying means comprising:
   first level detection means for detecting a level of an input signal to be inputted to said amplifying means;
   second level detection means for detecting a level of an output signal to be outputted from said amplifying means;
   amplitude compensating means for controlling an amplitude of said input signal in accordance with a difference between a signal level detected by said first detection means and a signal level detected by said second detection means to improve said linearity of said input-output characteristic of said amplifying means; and
   phase compensating means for controlling a phase of said input signal in accordance with a level of an output signal detected by said second level detection means; and
   wherein said phase compensating means has a characteristic that cancels a phase change of said output signal induced by amplitude compensation of said amplitude compensating means.

3. The linear compensating circuit as claimed in claim 1, wherein at least one of said first and second level detection means is a detector.

4. A linear compensating circuit for maintaining a linearity of an input-output characteristic of an amplifying means comprising:
   first level detection means for detecting a level of an input signal to be inputted to said amplifying means;
   second level detection means for detecting a level of an output signal to be outputted from said amplifying means;
   amplitude compensating means for controlling an amplitude of said input signal in accordance with a difference between a signal level detected by said first detection means and a signal level detected by said second detection means to improve said linearity of said input-output characteristic of said amplifying means; and
   phase compensating means for controlling a phase of said input signal in accordance with a level of an output signal detected by said second level detection means;
   wherein at least one of said input and output signals is provided through a branching circuit; and wherein said branching circuit has means for controlling the level of a signal to be provided.

5. The linear compensating circuit as claimed in claim 1, wherein said amplifying means is a power amplifier.

6. An amplifier comprising:
   amplifier means;
   first level detection means for detecting a level of an input signal to be inputted to said amplifying means;
   second level detection means for detecting a level of an output signal to be inputted to said amplifying means;
   amplitude compensating means for controlling an amplitude of said input signal in accordance with a difference between a signal level detected by said first detection means and a signal level detected by said second detection means to improve a linearity of an input-output characteristic of said amplifying means; and
   phase compensating means for controlling a phase of said input signal in accordance with a level of an output signal detected by said second level detection means; and
   wherein said phase compensating means has a characteristic that cancels a phase change of said output signal induced by amplitude compensation of said amplitude compensating means.

7. The amplifier as claimed in claim 6, wherein at least one of said first and second level detection means is a detector.

8. The amplifier as claimed in claim 6, wherein at least one of said input and output signals is provided through a branching circuit.

9. An amplifier comprising:
   amplifier means;
   first level detection means for detecting a level of an input signal to be inputted to said amplifying means;

second level detection means for detecting a level of an output signal to be inputted to said amplifying means;

amplitude compensating means for controlling an amplitude of said input signal in accordance with a difference between a signal level detected by said first detection means and a signal level detected by said second detection means to improve a linearity of an input-output characteristic of said amplifying means; and phase compensating means for controlling a phase of said input signal in accordance with a level of an output signal detected by said second level detection means; and wherein at least one of said input and output signals is provided through a branching circuit and wherein said branching circuit includes means for controlling the level of a signal to be provided.

10. The amplifier as claimed in claim 6, wherein said amplifying means is a power amplifier.

11. A linear compensating circuit for compensating a linearity of an input-output characteristic of amplifying means comprising:

first level detection means for detecting a level of an input signal to be inputted to said amplifying means;

second level detection means for detecting a level of an input signal to be inputted to said amplifying means;

amplitude compensating means for controlling an amplitude of said input signal in accordance with a difference between a signal level detected by said first detection means and a signal level detected by said second detection means thereby improving a linearity of an input-output characteristic of said amplifying means;

phase compensating means for controlling a phase of said input signal in accordance with a level of an output signal detected by said second level detection means; and a differential amplifier for amplifying a difference between an output of said first level detection means and an output of said second detection means to send it to said amplitude compensating means.

12. The linear compensating circuit as claimed in claim 11, wherein said amplitude compensating means is effective to increase and decrease said input signal.

13. The linear compensating circuit as claimed in claim 11, further comprising first and second branching circuits through which said input and output signals are taken out respectively, said first and second branching circuits being able to control a level of said signal to be sent out to said first and second detection means, respectively.

14. An amplifier comprising:

amplifier means;

first level detection means for detecting a level of an input signal to be inputted to said amplifying means;

second level detection means for detecting a level of an output signal to be inputted to said amplifying means;

amplitude compensating means for controlling an amplitude of said input signal in accordance with a difference between a signal level detected by said first detection means and a signal level detected by said second detection means to improve a linearity of an input-output characteristic of said amplifying means;

phase compensating means for controlling a phase of said input signal in accordance with a level of an output signal detected by said second level detection means;

and a differential amplifier for amplifying a difference between an output of said first level detection means and an output of said second detection means to send it to said amplitude compensating means.

15. The linear compensating circuit as claimed in claim 14, wherein said amplitude compensating means has functions of increasing and decreasing said input signal.

16. The linear compensating circuit as claimed in claim 14, further comprising first and second branching circuits through which said input and output signals are taken out respectively, said first and second branching circuits being able to control a level of said signal to be sent out to said first and second detectors, respectively.

* * * * *